(12) United States Patent
Zhang et al.

(10) Patent No.: US 12,352,782 B2
(45) Date of Patent: Jul. 8, 2025

(54) SEMICONDUCTOR TESTING SOCKET

(71) Applicant: Antares Advanced Test Technologies (Suzhou) Limited, Jiangsu (CN)

(72) Inventors: Long Zhang, Jiangsu (CN); Chunli Zhuo, Jiangsu (CN); Jinrong Chen, Jiangsu (CN)

(73) Assignee: Antares Advanced Test Technologies (Suzhou) Limited, Jiangsu (CN)

( * ) Notice: Subject to any disclaimer, the term of this patent is extended or adjusted under 35 U.S.C. 154(b) by 102 days.

(21) Appl. No.: 18/260,548

(22) PCT Filed: Jan. 6, 2022

(86) PCT No.: PCT/CN2022/070490
§ 371 (c)(1),
(2) Date: Jul. 6, 2023

(87) PCT Pub. No.: WO2022/148395
PCT Pub. Date: Jul. 14, 2022

(65) Prior Publication Data
US 2024/0302408 A1    Sep. 12, 2024

(30) Foreign Application Priority Data
Jan. 6, 2021   (CN) .......................... 202110013375.1

(51) Int. Cl.
G01R 1/04        (2006.01)
G01R 1/02        (2006.01)
G01R 1/067       (2006.01)
G01R 1/073       (2006.01)
G01R 31/00       (2006.01)
(Continued)

(52) U.S. Cl.
CPC .................................. *G01R 1/0466* (2013.01)

(58) Field of Classification Search
CPC . G01R 1/02; G01R 1/04; G01R 1/067; G01R 1/073; G01R 31/00; G01R 31/26; G01R 31/28
See application file for complete search history.

(56) References Cited

U.S. PATENT DOCUMENTS

2021/0156906 A1*  5/2021  Furukawa ..........  G01R 31/2891

FOREIGN PATENT DOCUMENTS

| CN | 102095946 A | 6/2011 |
|----|-------------|--------|
| CN | 108885227 A | 11/2018 |
| CN | 111417857 A | 7/2020 |

(Continued)

*Primary Examiner* — Neel D Shah
(74) *Attorney, Agent, or Firm* — Armstrong Teasdale LLP

(57) ABSTRACT

The disclosed semiconductor testing socket comprises a testing socket body, a guiding frame, and a height adjusting mechanism. The guiding frame is mounted above the testing socket body and is provided with a central insertion opening. The height adjusting mechanism is embedded at the edges of the central insertion opening. The height adjusting mechanism comprises an operable part that can be operated and a movable part that can be moved between a first position located outside the central insertion opening and a second position located within the central insertion opening by operating the operable part. The movable part comprises a supporting surface configured for supporting a specimen to be tested when located at the second position.

15 Claims, 4 Drawing Sheets

(51) Int. Cl.
*G01R 31/26* (2020.01)
*G01R 31/28* (2006.01)

(56) References Cited

FOREIGN PATENT DOCUMENTS

| | | |
|---|---|---|
| CN | 214898333 U | 11/2021 |
| JP | 2007335639 A | 12/2007 |

* cited by examiner

SEMICONDUCTOR TESTING SOCKET

CROSS-REFERENCE TO RELATED APPLICATIONS

This application is a National Phase entry claiming the benefit of priority under 35 U.S.C. § 371 to International Patent Application No. PCT/CN2022/070490 filed Jan. 6, 2022 and titled Semiconductor Testing Socket, which claims the benefit of priority to Chinese Patent Application No. 202110013375.1 filed Jan. 6, 2021, the contents of which are hereby incorporated by reference herein.

FIELD

The present disclosure relates to the field of semiconductor packaging and testing, in particular to a semiconductor testing socket.

BACKGROUND

In the testing of semiconductor packaging, essentially the same testing socket may be used since the pin information of the chips is identical, although the local structures of packaging may vary because the same wafer may be packaged in different forms. For example, for ball grid array (BGA) packaging and land grid array (LGA) packaging, the difference between them only lies in that the bottom of the chip in BGA packaging is a solder ball while the bottom of the chip in LGA packaging is a flat surface. In the testing, many parameters of the testing equipment (e.g., the optimal height of use of the probe, and the limiting of the testing cover or testing press head) are defined on the basis of the testing socket. Therefore, exchange between testing sockets in different heights is required to test chips in BGA packaging and LGA packaging. As a result, the testing efficiency is low in the testing of chips in different types of packaging since the testing sockets have to be replaced.

BRIEF DESCRIPTION

To overcome the problem of low testing efficiency resulted from the inadaptability of the testing sockets to different types of packaging in the prior art, the present disclosure provides a semiconductor testing socket, which is adaptive to the testing of chips in different types of packaging.

In one aspect, the present disclosure provides a semiconductor testing socket, comprising a testing socket body, a guiding frame, and a height adjusting mechanism, wherein the guiding frame is mounted above the testing socket body and is provided with a central insertion opening; the height adjusting mechanism is embedded at the edges of the central insertion opening; the height adjusting mechanism comprises an operable part that can be operated and a movable part that can be moved between a first position located outside the central insertion opening and a second position located within the central insertion opening by operating the operable part; and the movable part comprises a supporting surface configured for supporting a specimen to be tested when it is located at the second position.

Optionally, the guiding frame is provided with a through-hole arranged in the height direction, and the operable part is arranged to be approachable via the through-hole so that it can be operated from outside.

Optionally, the central insertion opening is rectangular in shape, and four corners of the central insertion opening are provided with the height adjusting mechanism respectively.

Optionally, the movable part comprises a first supporting edge and a second supporting edge that are arranged perpendicular to each other and a movable block connecting the first supporting edge and the second supporting edge, wherein the movable block is arranged to be movable diagonally at the corner where the height adjusting mechanism is located.

Optionally, the operable part comprises a driving block and a sliding block connected to the driving block, wherein the driving block is rotatably arranged inside the through-hole, the sliding block is arranged offset from a rotation axis of the driving block, the movable block is provided with a sliding channel thereon, and the sliding block is rotatably and slidingly fitted in the sliding channel.

Optionally, a resistive element for increasing rotational resistance is provided between the through-hole and the driving block.

Optionally, the driving block is provided with a rotating slot to facilitate a rotating operation from outside.

Optionally, the driving block is provided with an indication mark for indicating the position of rotation, and the top surface of the guiding frame is provided with a first indicator and a second indicator that are configured to correspond to the indication mark at the first position and the second position.

Optionally, the sliding channel is a linear channel, and the sliding block is cylindrical in shape.

Optionally, the guiding frame is provided with guiding slots at the corners of the central insertion opening for guiding the first supporting edge and the second supporting edge; and/or the testing socket body is provided with a limiting edge for limiting the movable part at the second position.

Accordingly, for a given specific type of packaging, the specimen to be tested can be selectively supported on the supporting surface when located at the second position or supported on the top surface of the testing socket body. That is to say, by operating the height adjusting mechanism, the parameters of the testing equipment can be set with reference to the top surface of the guiding frame after a specimen in a different type of packaging is inserted into the central insertion opening, without replacing the testing socket; thus, the testing efficiency is improved.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Some embodiments of the present disclosure will be detailed below with reference to the accompanying drawings. It should be understood that the embodiments described herein are only provided to describe and explain the present disclosure, but are not intended to constitute any limitation to the present disclosure.

In the present disclosure, unless otherwise specified, the terms that denote the orientations are used as follows, for example: "top", "bottom", "left" and "right" usually refer to "top", "bottom", "left" and "right" as shown in the accompanying drawings; "inside" and "outside" refer to inside and outside in relation to the outlines of the components. The present application will be detailed below in embodiments with reference to the accompanying drawings.

Figure 1:
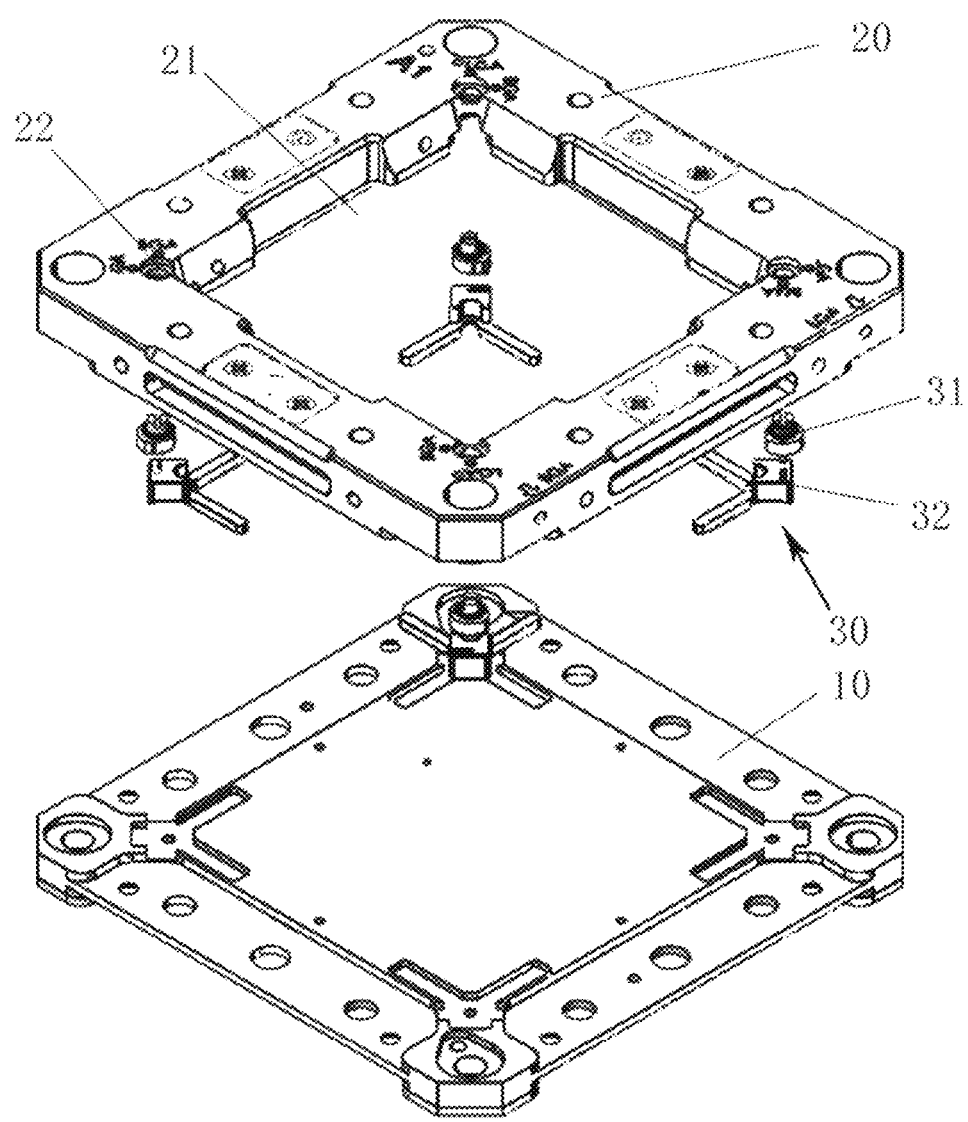
FIG. 1 is an exploded view of an embodiment of the semiconductor testing socket according to the present disclosure.
Figure 6:
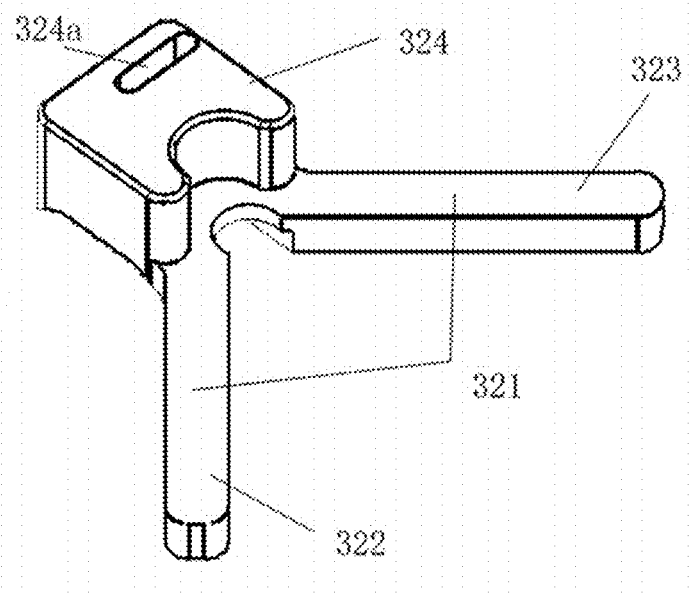
FIG. 6 is an isometric view of the movable part in FIG. 1.

Referring to FIG. 1, the present application provides a semiconductor testing socket, which comprises a testing socket body 10, a guiding frame 20, and a height adjusting mechanism 30, wherein the guiding frame 20 is mounted above the testing socket body 10 and is provided with a central insertion opening 21; the height adjusting mechanism 30 is embedded at the edges of the central insertion opening 21; the height adjusting mechanism 30 comprises an operable part 31 that can be operated and a movable part 32 that can be moved between a first position located outside the central insertion opening 21 and a second position located within the central insertion opening 21 by operating the operable part 31; and, with reference to FIG. 6, the movable part 32 comprises a supporting surface 321 configured for supporting a specimen to be tested when it is located at the second position.

With the semiconductor testing socket provided in the present disclosure, according to the specific type of packaging, the specimen to be tested may be selectively supported on the supporting surface when located at the second position or supported on the top surface of the testing socket body 10. That is to say, by operating the height adjusting mechanism 30, the parameters of the testing equipment may be set with reference to the top surface of the guiding frame 20 after a specimen in a different type of packaging is inserted into the central insertion opening 21, without replacing the testing socket; thus, the testing efficiency is improved.

Referring again to FIG. 1, it should be understood that the supporting surface 321 is located between the top surface of the testing socket body 10 and the top surface of the guiding frame 20. To facilitate using the top surface of the guiding frame 20 as a positioning reference, the height adjusting mechanism 30 may be embedded in the guiding frame 20 to avoid protruding out of the top surface of the guiding frame 20 and interfering with relevant operations. In such a case, to facilitate operating the operable part 31, the guiding frame 20 is provided with a through-hole 22 arranged in the height direction, and the operable part 31 is arranged to be approachable via the through-hole 22 so that it can be operated from outside.

In addition, to facilitate stably supporting the specimen to be tested at the first position by means of the supporting surface 321, the specimen to be tested may be supported at a plurality of positions in the circumferential direction of the central insertion opening 21. Preferably, as shown in FIG. 1, the central insertion opening 21 is rectangular in shape, and four corners of the central insertion opening 21 are provided with the height adjusting mechanism 30 respectively. In use, to support the specimen to be tested on the supporting surface 321, the specimen may be inserted through the central insertion opening 21, so that it is supported stably by the supporting surfaces 321 of the four height adjusting mechanisms 30 arranged at the four corners respectively. Of course, the four height adjusting mechanisms 30 may be operated to switch between the first position and the second position respectively.

Figure 2:
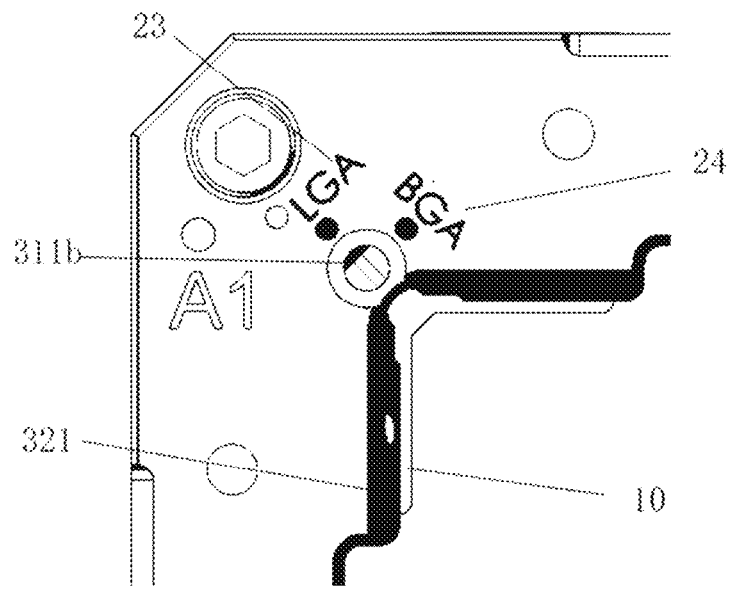
FIG. 2 is a schematic diagram of the movable part of one height adjusting mechanism of the semiconductor testing socket in FIG. 1 when the movable part is at the first position.

Preferably, as shown in FIGS. 2 and 6, the movable part 32 comprises a first supporting edge 322 and a second supporting edge 323 that are arranged perpendicular to each other and a movable block 322 connecting the first supporting edge 323 and the second supporting edge 324, wherein the movable block 324 is arranged to be movable diagonally at the corner where the height adjusting mechanism 30 is located. Thus, the top surfaces of the first supporting edge 322 and the second supporting edge 323 form the supporting surfaces 321 to support the adjacent edges of the corners of the specimen to be tested, thereby more stable supporting is provided. Additionally, the movable block 324 is located between the first supporting edge 322 and the second supporting edge 323 and may be moved in the diagonal direction at the corner. Thus, on one hand, the first supporting edge 322 and the second supporting edge 323 may be moved to proper positions at the same time conveniently; on the other hand, the structure can be simplified as far as possible and the space required for arranging and moving the movable part 32 can be reduced as far as possible, which is crucial to the semiconductor testing field in which the semiconductors have compact structures and associated minute-sized components.

Figure 7:
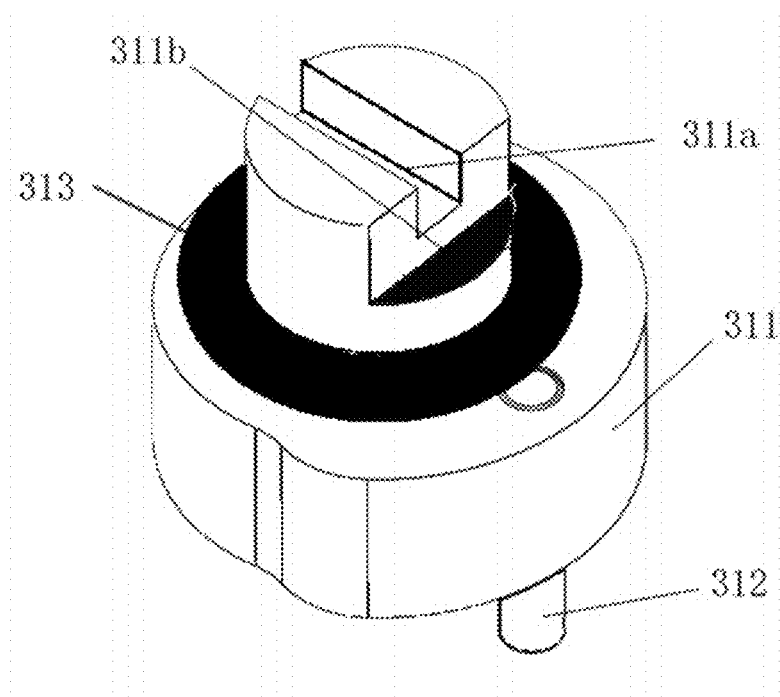
FIG. 7 is an isometric view of the operable part in FIG. 1.

As described above, the present application relates to the semiconductor testing field, in which the components have accurate dimensions and minute structures. In one embodiment, the movable blocks 324 are linearly displaced in the diagonal direction at the corners by rotating the operable part 31, so as to further reduce the required installation and movement spaces. Specifically, as shown in FIG. 7, the operable part 31 comprises a driving block 311 and a sliding block 311 connected to the driving block 312, wherein the driving block 311 is rotatably arranged inside the through-hole 22, the sliding block 312 is arranged offset from a rotation axis of the driving block 311, the movable block 324 is provided with a sliding channel 324a thereon, and the sliding block 312 is rotatably and slidingly fitted in the sliding channel 324a. Thus, the operable part 31 and the movable part 32 form a structure similar to a cam mechanism, so that the movable part 32 is linearly displaced by rotating the driving block 311, and the space required for arranging the operable part 31 is reduced at the same time.

When the semiconductor testing socket in the present disclosure is used for testing semiconductor packaging, usually the same type of packaging is tested in batch before the packaging is replaced by another type of packaging. Thus, the movable part 32 is kept at the current position during the testing, and is switched to another position by means of an intentional operation only when position change is desired. To that end, a resistive element 313 for increasing rotational resistance may be provided between the through-hole 22 and the driving block 311. Thus, the resistive element 313 can prevent the driving block 311 from rotating or prevent the movable part 32 from getting loose incurred by slight force as a result of any faulty operation. Specifically, the resistive element 313 may be in any appropriate form, as long as it provides certain resistance. For example, the resistive element 313 may be an O-ring.

To facilitate operating the driving block 311 to rotate it, as shown in FIG. 7, the driving block 311 may be provided with a rotating slot 311a to facilitate a rotating operation from outside. Specifically, to facilitating rotating the driving block 311 by means of a tool, the rotating slot 311a may be configured in a shape in fit with the tool. For example, to rotate the driving block 311 by means of a screwdriver, the rotating slot 311a may be a straight slot.

Figure 4:
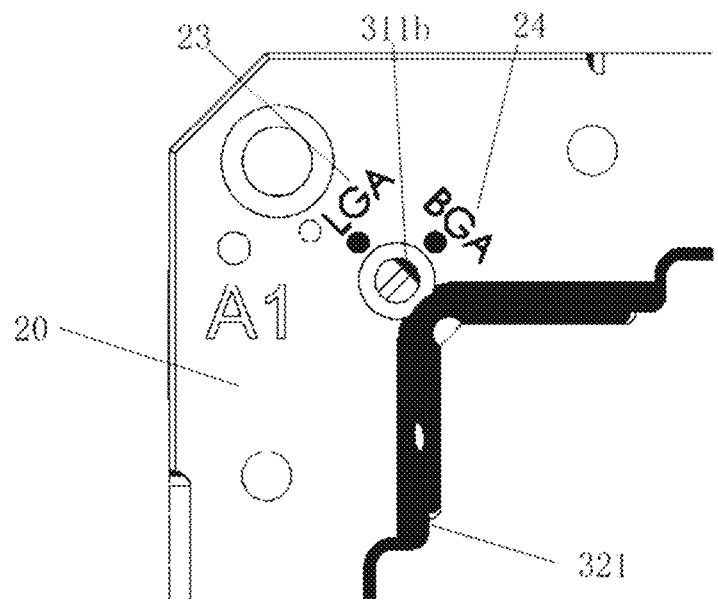
FIG. 4 is a schematic diagram of the movable part of one height adjusting mechanism of the semiconductor testing socket in FIG. 1 when the movable part is at the second position.

In addition, to simplify the structure, the switching of the movable part 32 between the first position and the second position is realized by means of a driving block 311 that rotates in a reciprocating manner within a certain range of angle. For example, to switch from the first position to the second position, the driving block 311 may be rotated in the clockwise direction; to switch from the second position to the first position, the driving block 311 may be rotated back in the counter-clockwise direction. To facilitate indicating the position of rotation of the driving block 311 with respect to the guiding frame 20 so as to determine the rotation direction for the switching operation, the driving block 311 is provided with an indication mark 311b for indicating the rotational position, and the top surface of the guiding frame 20 is provided with a first indicator 23 and a second indicator 24 that are configured to correspond to the indication mark at the first position and the second position. Specifically, as shown in FIG. 7, the indication mark 311b may be an indentation in the driving block 311, and may have an eye-striking color for visual indication. As shown in FIGS. 2 and 4, the first indicator 23 may be a LGA indicator, while the second indicator 24 may be a BGA indicator.

Besides, the sliding channel 324a and the sliding block 312 may be arranged as required in a way that they can be in rotatably and slidingly fit with each other, so that the movable part 32 can be linearly displaced by rotating the driving block 311. For example, the sliding channel 324a is a straight channel, and the sliding block 312 is cylindrical in shape. Specifically, the sliding channel 324a may extend in a direction perpendicular to the movement direction of the movable block 324 and extend diagonally from one side of the corner to the other side of the corner.

To ensure accurate movement of the movable part 32, a movement guide may be provided for the movable part 32. Specifically, the guiding frame 20 is provided with guiding slots at the corners of the central insertion opening 21 for guiding the first supporting edge 322 and the second supporting edge 323. As the movable part 32 is driven by the driving block 311 to move, the first supporting edge 322 and the second supporting edge 323 may move along the guiding slot respectively to ensure that the movable part 32 entirely moves diagonally at the corner.

In addition, the socket body 10 is provided with a limiting edge 11 for limiting the movable part 32 at the second position. Specifically, the socket body 10 may have a part extending into the central insertion opening 21, and the limiting edge 11 is an edge of the part that is oriented to the center of the central insertion opening 21. The limiting edge 11 may protrude upward with respect to the other portions of the part of the socket body 10 extending into the central insertion opening 21, so that it can stop the movable part 32 when the movable part 32 moves to the second position. Specifically, the limiting edge 11 may comprise a part parallel to the first supporting edge 322 and the second supporting edge 323. By means of the arrangement of the limiting edge 11, whether the movable part 32 has moved to the second position can be judged conveniently.

The use of the semiconductor testing socket in the present disclosure is described below with reference to the accompanying drawings.

The disclosed semiconductor testing socket is used to test chips in BGA packaging and chips in LGA packaging.

Figure 5:
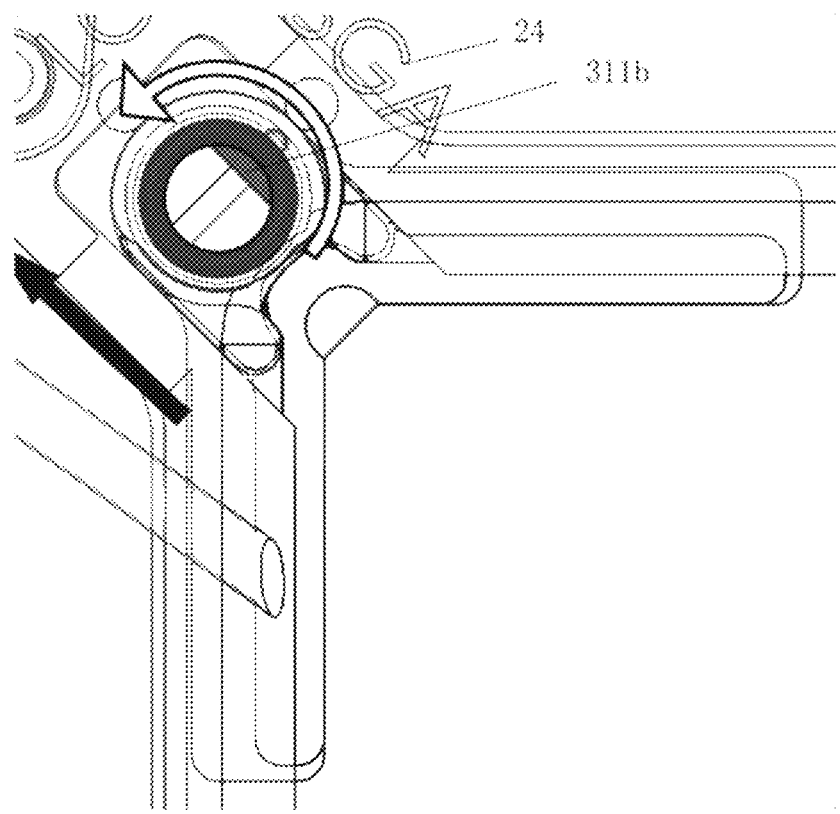
FIG. 5 is a view of the structure in FIG. 4 where the guiding frame is transparent.

To test a chip in BGA packaging, the movable part 32 is positioned at the second position, so as to support the chip by means of the supporting surface 321. However, if the movable part 32 is at the first position presently, i.e., the position shown in FIGS. 2 and 3, it can be seen that the indication mark 311b points to the first indicator 23, prompting the operator to rotate the driving block 311 in the clockwise direction. In that case, a screwdriver may be used to engage with the rotating slot 311a, to drive the driving block 311 to rotate in the clockwise direction, till the indication mark 311b points to the second indicator 24; at the same time, the driving block 311 drives the movable part 32 to move so that the first supporting edge 322 and the second supporting edge 323 move along the guiding slot into the central insertion opening 21, i.e., reach to the position shown in FIGS. 4 and 5, and the leading sides of the first supporting edge 322 and the second supporting edge 323 are stopped by the limiting edge 11. At that point, the chip in BGA packaging is inserted through the central insertion opening 21, so that the chip is supported by the first supporting edge 322 and the second supporting edge 323.

Figure 3:
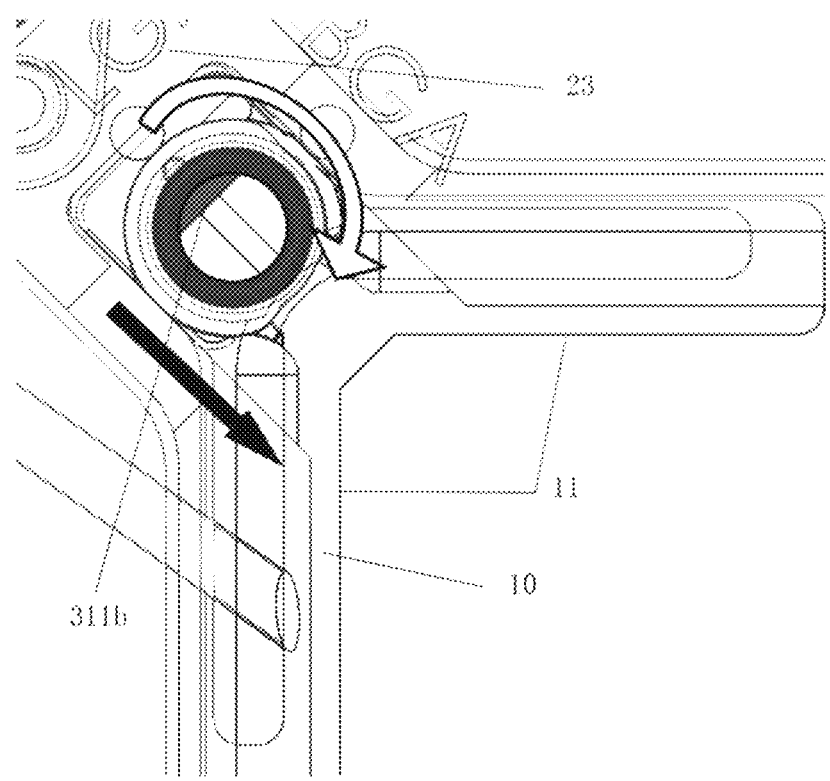
FIG. 3 is a view of the structure in FIG. 2 where the guiding frame is transparent.

To switch to test a chip in LGA packaging, the movable part 32 should be positioned at the first position, as shown in FIGS. 2 and 3, so that the chip is supported by the testing socket body 10. Based on the indication mark 311b pointing to the second indicator 24 and the relative positional relation between the first indicator 23 and the second indicator 24, the operator can conclude that the driving block 311 should be rotated in the counter-clockwise direction so as to move the movable part 32 to the first position. Specifically, the screwdriver may be used to engage with the rotating slot 311a to rotate the driving block 311 in the counter-clockwise direction, till the indication mark 311b points to the first indicator 23. At the same time, the driving block 311 drives the movable part 32 to move, so that the first supporting edge 322 and the second supporting edge 323 move out of the central insertion opening 21 along the guiding slot, i.e., reach to the position shown in FIGS. 2 and 3. At that point, the chip in LGA packaging is inserted through the central insertion opening 21, so that the chip is supported by the top surface of the testing socket body 10.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and proceeded with the word "a" or "an" should be understood as not excluding plural elements or steps unless such exclusion is explicitly recited. Furthermore, references to "one embodiment" of the present disclosure or "an example embodiment" are not intended to be interpreted as excluding the existence of additional embodiments that also incorporate the recited features.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor testing socket, comprising:
   a testing socket body;
   a guiding frame; and
   a height adjusting mechanism;
   wherein the guiding frame is mounted above the testing socket body and is provided with a central insertion opening;
   wherein the height adjusting mechanism is embedded at edges of the central insertion opening;
   wherein the height adjusting mechanism comprises an operable part that can be operated and a movable part that can be moved between a first position located outside the central insertion opening and a second position located within the central insertion opening by operating the operable part; and
   wherein the movable part comprises a supporting surface configured for supporting a specimen to be tested when it is located at the second position.

2. The semiconductor testing socket of claim 1, wherein the guiding frame is provided with a through-hole arranged in a height direction, and wherein the operable part is arranged to be approachable via the through-hole so that it can be operated from outside.

3. The semiconductor testing socket of claim 1, wherein the central insertion opening is rectangular in shape, and the semiconductor testing socket further comprises, at four corners of the central insertion opening, respective height adjusting mechanisms.

4. The semiconductor testing socket of claim 3, wherein the movable part of the respective height adjusting mechanisms comprises:
   a first supporting edge and a second supporting edge that are arranged perpendicular to each other; and
   a movable block connecting the first supporting edge and the second supporting edge; and
   wherein the movable block is arranged to be movable diagonally at a corner, of the four corners of the central insertion opening, where the height adjusting mechanism is located.

5. The semiconductor testing socket of claim 4, wherein the operable part of the respective height adjusting mechanisms comprises:
   a driving block; and
   a sliding block connected to the driving block;
   wherein the driving block is rotatably arranged inside a through-hole disposed in the guiding frame;
   wherein the sliding block is arranged offset from a rotation axis of the driving block;
   wherein the movable block comprises a sliding channel thereon; and
   wherein the sliding block is rotatably and slidingly fitted in the sliding channel.

6. The semiconductor testing socket of claim 4, wherein:
   the guiding frame comprises guiding slots at the four corners of the central insertion opening for guiding first supporting edges and second supporting edges of the respective height adjusting mechanisms; and
   the testing socket body comprises a limiting edge for limiting the movable part of the respective height adjusting mechanisms at the second position.

7. The semiconductor testing socket of claim 5 further comprising a resistive element for increasing rotational resistance and disposed between the through-hole and the driving block.

8. The semiconductor testing socket of claim 5, wherein the driving block comprises a rotating slot to facilitate a rotating operation from outside.

9. The semiconductor testing socket of claim 5, wherein the driving block comprises an indication mark for indicating a position of rotation, and a top surface of the guiding frame comprises a first indicator and a second indicator that are configured to correspond to the indication mark at the first position and the second position.

10. The semiconductor testing socket of claim 5, wherein the sliding channel is a linear channel; and wherein the sliding block is cylindrical in shape.

11. The semiconductor testing socket of claim 5, wherein:
    the guiding frame comprises guiding slots at the four corners of the central insertion opening for guiding first supporting edges and second supporting edges of the respective height adjusting mechanisms; and
    the testing socket body comprises a limiting edge for limiting the movable part of the respective height adjusting mechanisms at the second position.

12. The semiconductor testing socket of claim 7, wherein:
    the guiding frame comprises guiding slots at the four corners of the central insertion opening for guiding first supporting edges and second supporting edges of the respective height adjusting mechanisms; and
    the testing socket body comprises a limiting edge for limiting the movable part of the respective height adjusting mechanisms at the second position.

13. The semiconductor testing socket of claim 8, wherein:
    the guiding frame comprises guiding slots at the four corners of the central insertion opening for guiding first supporting edges and second supporting edges of the respective height adjusting mechanisms; and
    the testing socket body comprises a limiting edge for limiting the movable part of the respective height adjusting mechanisms at the second position.

14. The semiconductor testing socket of claim 9, wherein:
- the guiding frame comprises guiding slots at the four corners of the central insertion opening for guiding first supporting edges and second supporting edges of the respective height adjusting mechanisms; and
- the testing socket body comprises a limiting edge for limiting the movable part of the respective height adjusting mechanisms at the second position.

15. The semiconductor testing socket of claim 10, wherein:
- the guiding frame comprises guiding slots at the four corners of the central insertion opening for guiding first supporting edges and second supporting edges of the respective height adjusting mechanisms; and
- the testing socket body comprises a limiting edge for limiting the movable part of the respective height adjusting mechanisms at the second position.

* * * * *